United States Patent
Layman et al.

(10) Patent No.: US 7,049,199 B2
(45) Date of Patent: May 23, 2006

(54) METHOD OF ION IMPLANTATION FOR ACHIEVING DESIRED DOPANT CONCENTRATION

(75) Inventors: Paul Arthur Layman, Orlando, FL (US); Samir Chaudhry, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/619,058

(22) Filed: Jul. 14, 2003

(65) Prior Publication Data

US 2004/0014303 A1    Jan. 22, 2004

Related U.S. Application Data

(62) Division of application No. 09/968,388, filed on Sep. 28, 2001, now abandoned.

(51) Int. Cl.
  *H01L 21/336*    (2006.01)
  *H01L 21/265*    (2006.01)

(52) U.S. Cl. .............. 438/302; 438/419; 438/473; 438/519; 438/525

(58) Field of Classification Search ............. 438/302, 438/418, 419, 473, 519, 525
See application file for complete search history.

(56) References Cited

U.S. PATENT DOCUMENTS

| 4,042,843 | A | 8/1977 | Sikes |
| 4,315,781 | A | 2/1982 | Henderson |
| 5,362,981 | A | 11/1994 | Sato et al. |
| 5,372,957 | A | 12/1994 | Liang et al. |
| 5,444,007 | A * | 8/1995 | Tsuchiaki .................... 438/421 |
| 5,589,410 | A | 12/1996 | Sato et al. |
| 5,817,551 | A | 10/1998 | Fujii et al. |
| 5,827,763 | A | 10/1998 | Gardner et al. |
| 5,841,170 | A | 11/1998 | Adan et al. |
| 6,020,244 | A | 2/2000 | Thompson et al. |
| 6,153,454 | A | 11/2000 | Krivokapic |
| 6,163,053 | A | 12/2000 | Kawashima |
| 6,187,619 | B1 | 2/2001 | Wu |
| 6,281,558 | B1 | 8/2001 | Sayama et al. |
| 6,297,098 | B1 | 10/2001 | Lin et al. |
| 6,524,903 | B1 | 2/2003 | Ootsuka et al. |
| 2002/0005553 | A1 | 1/2002 | Ootsuka et al. |
| 2002/0019103 | A1 | 2/2002 | Lin et al. |
| 2002/0036328 | A1 | 3/2002 | Richards et al. |

FOREIGN PATENT DOCUMENTS

JP           8-162424       *  6/1996

* cited by examiner

*Primary Examiner*—Hsien-Ming Lee

(57) ABSTRACT

A method for forming a plurality of MOSFETs wherein each one of the MOSFET has a unique predetermined threshold voltage. A doped well or tub is formed for each MOSFET. A patterned mask is then used to form a material line proximate each semiconductor well, wherein the width of the line is dependent upon the desired threshold voltage for the MOSFET. A tilted ion implantation is performed at an acute angle with respect to the substrate surface such that the ion beam passes through the material line. Thicker lines have a lower transmission coefficient for the ion beam and thus the intensity of the ion beam reaching the adjacent semiconductor well is reduced. By appropriate selection of the line width the dopant density in the well, and thus the final MOSFET threshold voltage, is controllable.

20 Claims, 16 Drawing Sheets

METHOD OF ION IMPLANTATION FOR ACHIEVING DESIRED DOPANT CONCENTRATION

This application claims the benefit of application Ser. No. 09/968,388 filed on Sep. 28, 2001 now abandoned.

FIELD OF THE INVENTION

The present invention is directed to semiconductor devices incorporating junctions of varying conductivity types designed to conduct current and methods of making such devices. More specifically, the present invention is directed to metal-oxide field-effect transistors (MOSFETs) having uniquely-determinable threshold voltages and methods for fabricating integrated circuits incorporating such devices.

BACKGROUND OF THE INVENTION

As is known to those skilled in the art, most metal-oxide-semiconductor field effect transistors (MOSFETs) are formed in a lateral orientation, with the current flowing parallel to the plane of the substrate or body surface in a channel between a source region and a drain region.

For an enhancement-mode n-channel MOSFET, the substrate is doped p-type and the source and drain regions are diffused or implanted with an n+ doping. A thin oxide layer separates the conductive gate from the silicon surface region between the source and drain regions. No current flows from the drain to the source region unless a conducting n-type channel is formed between the two n-type regions. When a positive voltage is applied to the gate relative to the substrate which is typically connected to the source, positive charges are in effect deposited on the gate metal and in response, negative charges are induced in the underlying silicon. These negative charges, that is mobile electrons, are formed within a thin inverted surface region of the silicon surface. These induced mobile electrons form the channel of the MOSFET and allow current to flow from the drain to the source. The effect of the gate voltage is to vary the conductance of the induced channel. Lowering the conductance lowers the barrier for the electrons to surmount between the source, channel and the drain. If the barrier is sufficiently reduced, by the application of a gate voltage in excess of a threshold voltage ($V_T$) then there is a significant electron flow from the source to the drain. The threshold voltage is the minimum gate voltage required to induce the channel, i.e., form the inverted region to drive the MOSFET into a conducting state. For an n-channel device, the positive gate voltage must be larger than a positive threshold voltage before a conducting channel is induced. Similarly, in a p-type channel device (which is made on an n-type substrate with a p-type source and drain implants or diffusions) requires a gate voltage more negative than some threshold value to induce the required positive charge (comprising mobile holes) in the channel.

The threshold voltage is a function of several MOSFET physical and electrical parameters, including the oxide capacitance, the oxide thickness, the difference in work functions between the gate material (typically metal or polysilicon) and the silicon substrate, the channel doping and the impurity ion charge storage within the gate oxide. As will be discussed below, and according to the prior art, typically the substrate doping concentration is varied to form MOSFETs with differing threshold voltages on a single integrated circuit.

A plurality of planar n-channel MOSFET active devices fabricated on an integrated circuit chip are shown in the FIG. 1 cross-sectional view. A substrate 9 comprises a p+ region 50 and a p− layer 52, the latter typically grown by an epitaxial technique from the p+ region. MOSFETs 2, 4 and 6 are fabricated in the substrate 9. The MOSFET 2 is separated from the MOSFET 4 by a LOCOS (local oxidation on silicon substrate) region 10. Similarly, the MOSFET 6 is separated from the MOSFET 4 by a LOCOS region 12. Alternatively, the MOSFETS 2, 4 and 6 may be electrically isolated by shallow trench isolation (STI) techniques, wherein an anisotropic etch forms a trench in the region between two active devices. The is filled with an insulative material.

The MOSFET 2 comprises a gate 14, a source region 16 and a drain region 18 diffused in an n-type well 20. The MOSFET 4 comprises a gate 28, a source region 30 and a drain region 32 diffused in a p-type well 34. Finally, the MOSFET 6 comprises a gate 38, a source region 40 and a drain region 42 diffused in an n-type well 44. The gates 14, 28 and 38 are separated from the substrate 9 by a silicon dioxide layer 46, also referred to as a gate oxide layer.

As FIG. 1 is intended to be a simplified representation of a portion of an integrated circuit, the various contacts, interconnects, vias and metal layers are not shown and the features are not drawn to scale. It is particularly advantageous, especially in digital applications, to fabricate a combination of n-channel and a p-channel MOSFETs on adjacent regions of a chip. This complementary MOSFET (CMOS) configuration is illustrated in the form of a basic inverter circuit in FIG. 2, comprising a PMOSFET 60 and an NMOSFET 62. The drains of the MOSFETs 60 and 62 are connected together to form the output terminal ($V_{out}$). The input terminal ($V_{in}$) is formed by the common connection of the MOSFET gates. The operating voltage is designated by $V_D$. In the FIG. 2 schematic, the PMOSFET 60 can be implemented by the structure of the MOSFET 2 in FIG. 1. The NMOSFET 62 can be implemented by the structure of the MOSFET 4 of FIG. 1.

State-of-the-art integrated circuit fabrication combines many different functions and subsystems onto a single chip, for example, combining different types of logic circuits, logic families and memory elements. For optimal performance and minimal power consumption individual devices on the integrated circuit may be operated at different operating voltages, i.e., the $V_D$ and $V_S$ values. Thus, the active devices must be fabricated with the necessary physical characteristics to accommodate the selected operating voltage. But in creating physical devices with these characteristics, it is also desirable to minimize and simplify the number of fabrication process steps.

For example, each of the MOSFETs 2, 4 and 6 of FIG. 1, may be designed to operate at a different operating voltage, i.e., $V_D/V_S$ and/or at a different threshold voltage, $V_T$. Generally, it is desirable to establish the device operating voltage at the minimum value that provides the required performance to minimize the power consumption of the devices, and thus overall, the power consumption of the chip. It is known, however, that there is a counter-effect; as the device operating voltage is reduced the operating speed of the device is also reduced. Therefore, to establish the optimum value for both of these parameters, it is necessary to operate the individual devices at operating voltages consistent with the required speed performance.

Given that there may be multiple operating voltages on a chip, there may also be multiple output voltages produced by the active elements and circuits of the chip. Thus the input circuit or device responsive to the preceding output voltage must be able to accommodate that output voltage and the active device must be designed to turn-on at the appropriate input voltage. For MOSFET and junction field-effect devices (JFETs) this turn-on voltage is the threshold voltage, the value of which is established by certain physical parameters of the device, as discussed above.

The prior art process of forming a plurality of MOSFETs with different threshold voltages is illustrated in FIGS. 3 through 6. At the conclusion of this process, each tub or well has a different doping density and therefore the MOSFET formed in each tub has a different threshold voltage. As shown in FIG. 3, a p+ substrate 100 carries an epitaxially grown p− layer 102 in which a plurality (three in this example) of n-type tubs are formed. Those skilled in the art recognize that the concepts presented are also applicable to the formation of p-type tubs or wells in a p or n-type substrate. To form the tubs, certain regions of the epitaxial layer 102 are masked by masks 104, 106, 108 and 110, with the space between these masks defining the tub regions. The arrows indicate the implantation of phosphorous or arsenic to create the n-type wells. Typically, the implant energy is 10 to 100 keV with a dose of 1E12 to 5E14 per $cm^2$.

As shown in FIG. 4, this implantation step forms three n-type wells, 120, 122 and 124, each having the same doping density. If all other physical and electrical parameters for the three wells are equivalent, then the threshold voltages at this point in the process are also equivalent. FIG. 4 further illustrates the application of a second implantation to the well 120, while the wells 122 and 124 (and other areas of the substrate 100) are masked by masks 126 and 128. Thus the final doping density and the threshold voltage for the MOSFET formed in the well 120 are determined by the parameters of the FIG. 4 implant into the well 120.

Continuing with FIG. 5, the wells 120 and 124 are masked by masks 130 and 132, respectively. An additional implant step is executed for the well 122 to establish the final doping density and threshold voltage for the MOSFET formed therein. Finally, as shown in FIG. 6, the wells 120 and 122 are masked with a mask 134 and the remainder of the substrate 100 is masked, as necessary, by a mask 136. Now an additional implant is made in the well 124 for establishing its doping density and thus the threshold voltage for the MOSFET formed therein. Although this process is readily extendable to any number of MOSFETs on an integrated circuit, note that it requires a number of unique masks and masking steps based on the number of threshold voltages required on the integrated circuit. It is always desirable in the fabrication of integrated circuits to reduce the number of masks, as they are expensive to design and manufacture, and the number of fabrication process steps.

As is well known to those skilled in the art, at this point fabrication of the MOSFETs proceeds conventionally. For each MOSFET, a gate oxide is grown or deposited followed by formation of the gate. The gate serves as a mask for a first low-dose implant to form the lightly doped drain and source regions. A relatively thick layer of silicon dioxide is then deposited, for instance, by chemical vapor deposition and certain portions thereof are anisotropically etched, leaving only two sidewall spacers adjacent the gate. The spacers serve as a mask for a high-dose dopant implant to form the source and drain regions. After a drive-in diffusion step, the source and drain regions and the adjacent lightly-doped regions are formed.

BRIEF SUMMARY OF THE INVENTION

To provide further advances in the formation of multiple threshold voltages for semiconductor devices, a method is provided for forming MOSFET devices having different threshold voltage values.

According to one embodiment of the invention, an integrated circuit semiconductor device includes a plurality of doped tubs or wells in which the source, drain and channel regions are later formed. The dopant density in each well is established to produce the required threshold voltage for the MOSFET device formed in that well. To create different doping levels in the tubs, a tilted implant is performed through patterned lines of photoresist, polysilicon, silicon dioxide, silicon nitride, or any material that blocks or impedes the transmission of implanting ions therethrough. Each line in the patterned layer has a different width for controlling the number of implanting ions that penetrate the patterned layer and enter the substrate in the region adjacent the line. For the same ion implantation energy (typically measured in keV) more ions will penetrate a thinner line in the layer than a thicker line. Thus a tub formed by implantation through an adjacent thinner pattern line has a higher doping density and the MOSFET formed therein has a higher threshold voltage.

The method according to the present invention reduces the cost and complexity of forming MOSFETs with different threshold voltages. A plurality of MOSFETs with a range of threshold voltage values can be formed simultaneously with no additional masking steps.

BRIEF DESCRIPTION OF THE DRAWINGS

The present invention can be more easily understood and the further advantages and uses thereof more readily apparent, when considered in view of the description of the preferred embodiments and the following figures in which.

In accordance with common practice, the various described features are not drawn to scale, but are drawn to emphasize specific features relevant to the invention. Reference characters denote like elements throughout the figures and text.

DETAILED DESCRIPTION OF THE INVENTION

Figure 1:
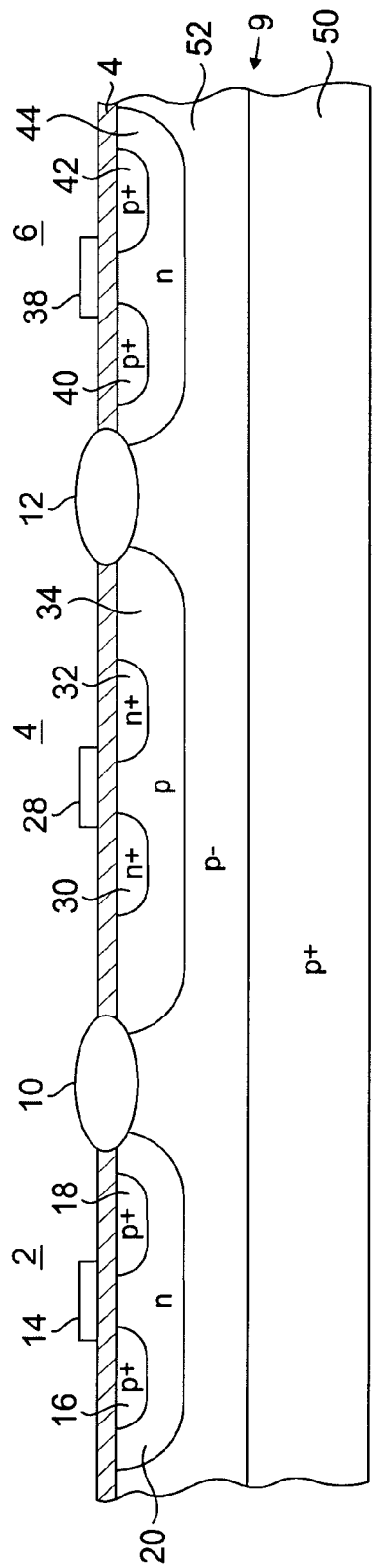
FIG. 1 is a cross-sectional view of a prior art MOSFET devices.
Figure 2:
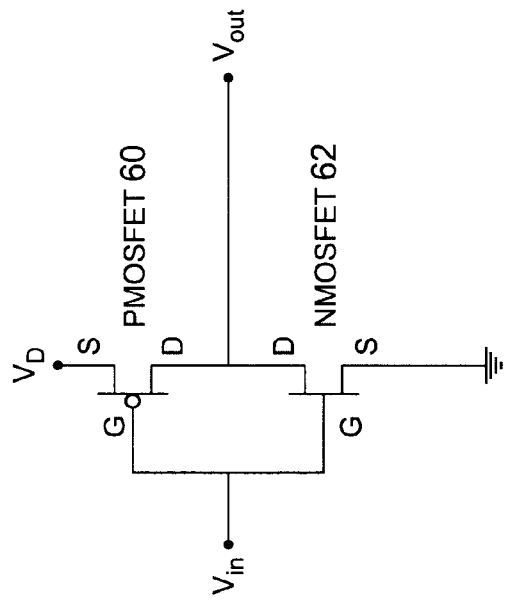
FIG. 2 is a partial schematic of a prior art CMOS integrated circuit.
Figure 3:
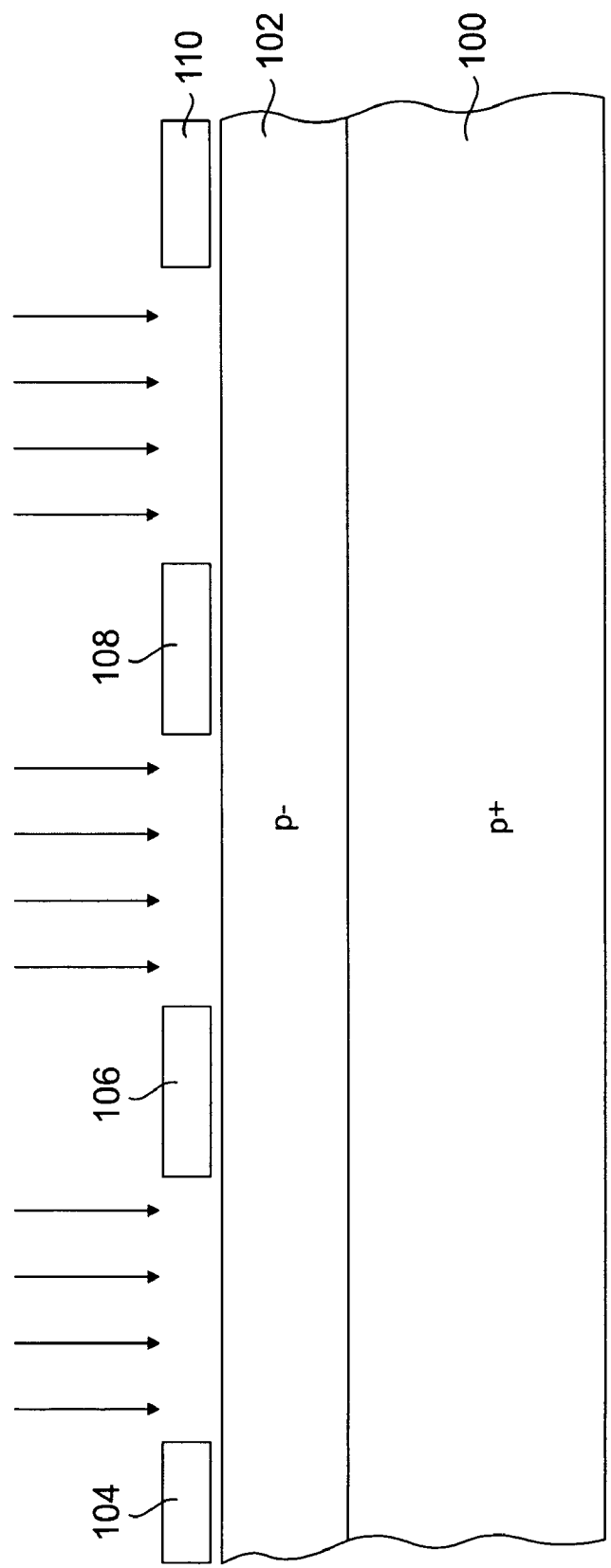
FIGS. 3 illustrates in cross-section, a prior art first implanting step, one step in a process for forming MOSFETs with different threshold voltages.
Figure 4:
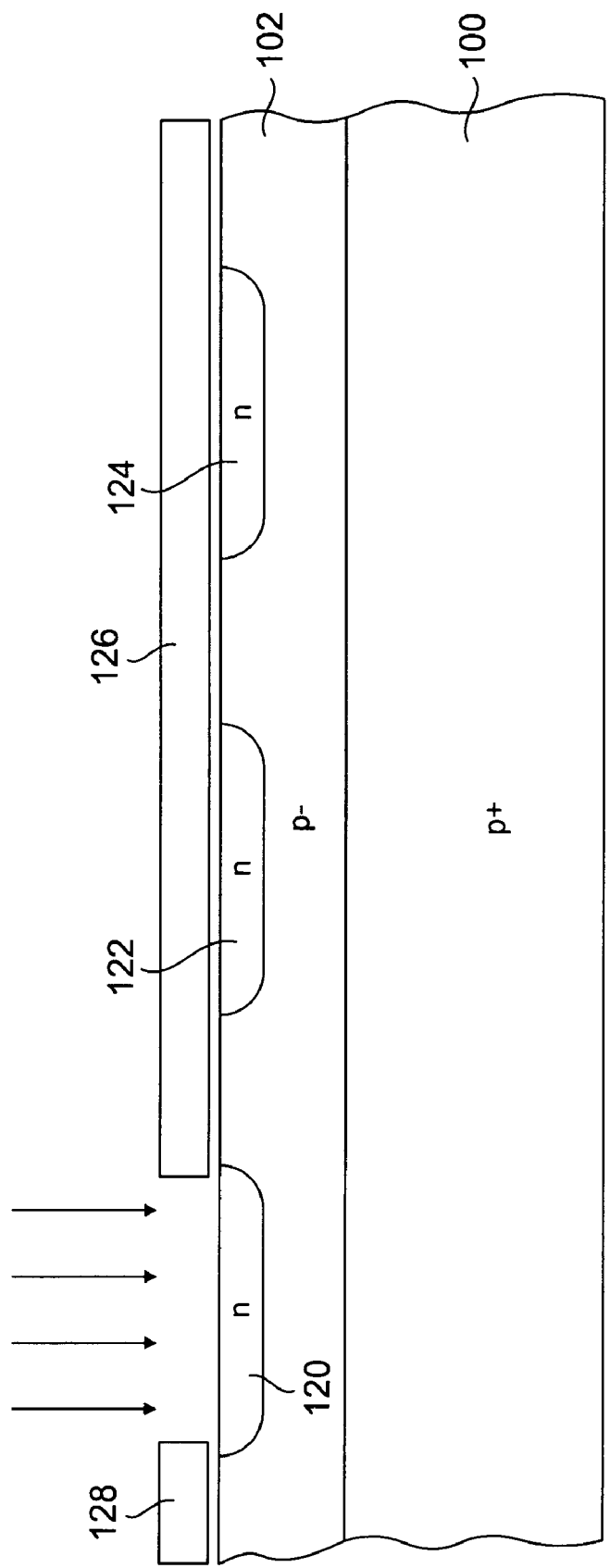
FIG. 4 illustrates, in cross-section, a prior art second implanting step, one step in a process for forming MOSFETs with different threshold voltages.
Figure 5:
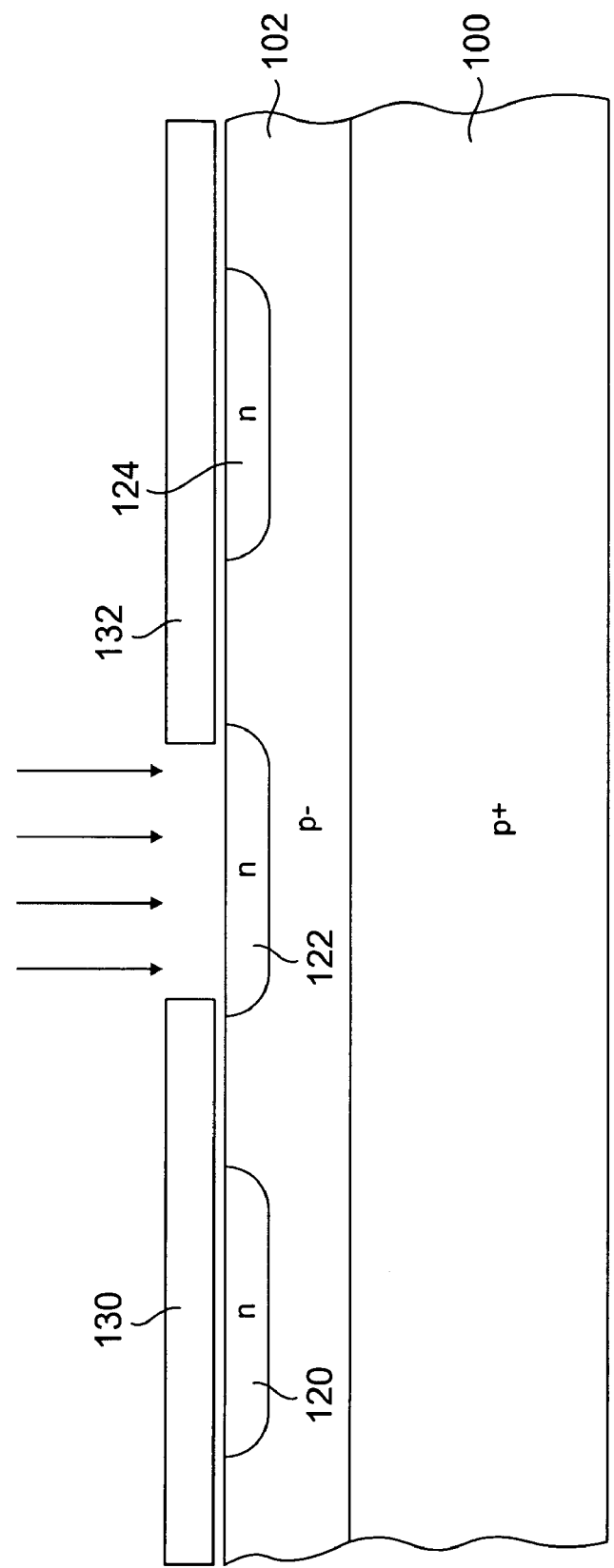
FIG. 5 illustrates, in cross-section, a prior art third implanting step, one step in a process for forming MOSFETs with different threshold voltages.
Figure 6:
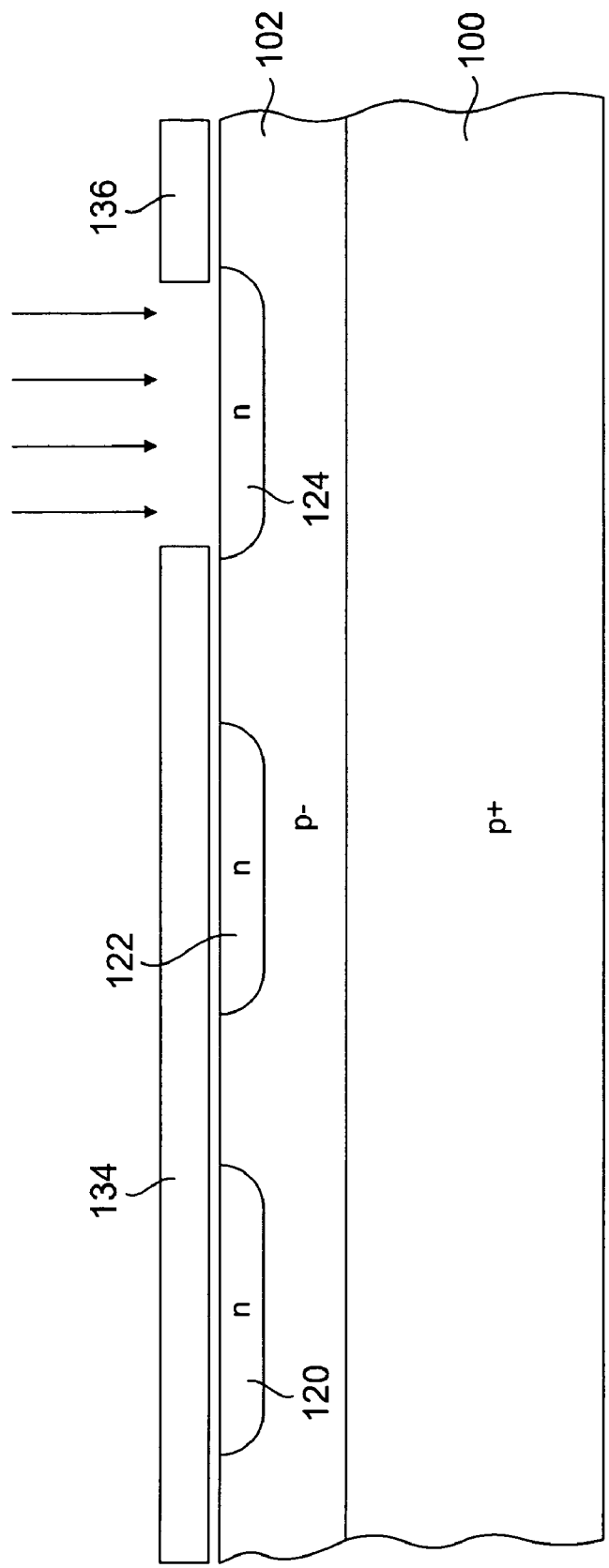
FIG. 6 illustrates, in cross-section, a prior art fourth implanting step, one step in a process for forming MOSFETs with different threshold voltages.
Figure 7:
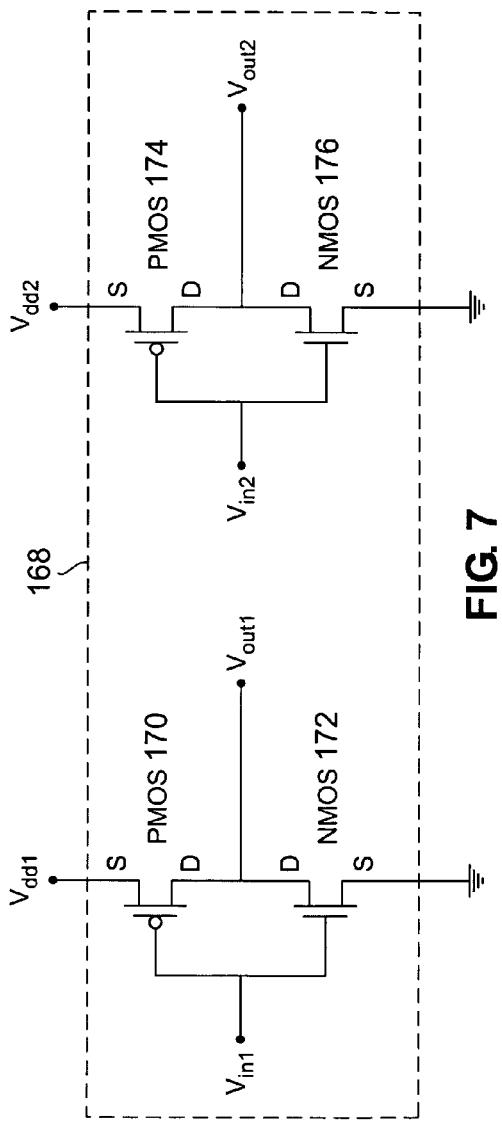
FIGS. 7 and 8 illustrate prior art integrated circuits in schematic form.

FIG. 7 is a partial schematic of a prior art CMOS integrated circuit 168 illustrating two pairs of CMOS devices. PMOSFET 170 and NMOSFET 172 form a first CMOS pair; PMOSFET 174 and NMOSFET 176 form a second CMOS pair. $V_{in_1}$ is the gate driving signal for the PMOSFET 170 and the NMOSFET 172, which creates an output signal ($V_{out_1}$) at the common drain connection. $V_{in_2}$ is the gate signal for the CMOS pair PMOSFET 174 and NMOSFET 176, which produces an output signal $V_{out_2}$. Note further that PMOSFET 170 is responsive to a drain voltage $V_{dd1}$, and PMOSFET 174 is responsive to a drain voltage $V_{dd2}$. The drain voltages $V_{dd1}$ and $V_{dd2}$ may be produced off-chip or on-chip, although they are illustrated in FIG. 7 as originating from an off-chip voltage source. Because in one embodiment $V_{dd1}$ and $V_{dd2}$ are not equal, $V_{out_1}$ is not equal to $V_{out_2}$. In a typical circuit configuration, both output signals $V_{out_1}$ and $V_{out_2}$ drive the next active element in a cascaded circuit chain. For instance, $V_{out_1}$ can serve as the input signal $V_{in_2}$, and $V_{out_2}$ can be supplied to another element in the integrated circuit 168 or sent off-chip. $V_{in_1}$ may be produced by another circuit within the integrated circuit 168 or originate from an off-chip source. In any case, it is clear that the use of different operating voltages ($V_{dd1}$ and $V_{dd2}$) and input/output voltages ($V_{in_1}$, $V_{in2}$, $V_{out_1}$ and $V_{out_2}$) may require the formation of MOSFETs with different threshold voltages. As a result, for example, the CMOS pair comprising PMOSFET 170 and NMOSFET 172 may be fabricated with a first threshold voltage and the CMOS pair PMOSFET 174 and NMOSFET 176 may be fabricated with a second threshold voltage.

Figure 8:
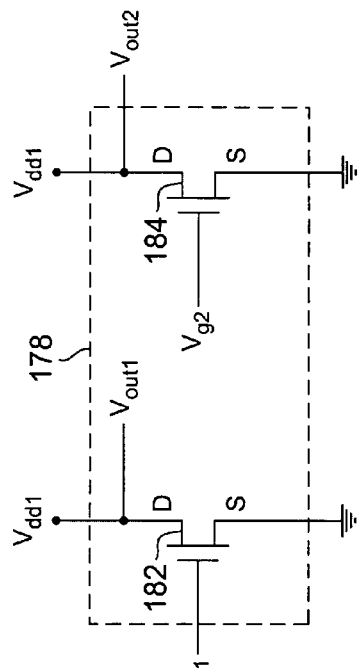

FIG. 8 illustrates another exemplary integrated circuit 178 comprising an NMOSFET device 182 and an NMOSFET device 184. As in FIG. 7, the input signals $V_{g1}$ and $V_{g2}$ may not be in the same voltage range and thus the NMOSFET devices 182 and 184 must each be fabricated to accommodate a different threshold voltage input signal. Note, in this case that the drain terminals of both NMOSFET 182 and NMOSFET 184 are connected to a single supply voltage, $V_{dd1}$. The fact that each transistor is operated from the same supply voltage is not necessarily determinative of the threshold voltage required to accommodate the gate input signals. Because the MOSFET threshold voltages are chosen based on a number of design and operating characteristics of the integrated circuit, it is possible that several different threshold voltage MOSFETs will be required on a state-of-the-art integrated circuit.

With reference to FIG. 7, it can be seen that the PMOSFET 170 and NMOSFET 172 can be fabricated with a first threshold voltage, while the PMOSFET 174 and the NMOSFET 176 can be fabricated with a second threshold voltage. As will be appreciated by application of the invention to the circuit of FIG. 8, the relevance of the present invention is not limited to CMOS applications, but can instead be applied to individual MOSFETs, whether such MOSFETs are interconnected to form logic circuits, signal processing circuits, basic CMOS building block circuits or memory devices.

Figure 9:
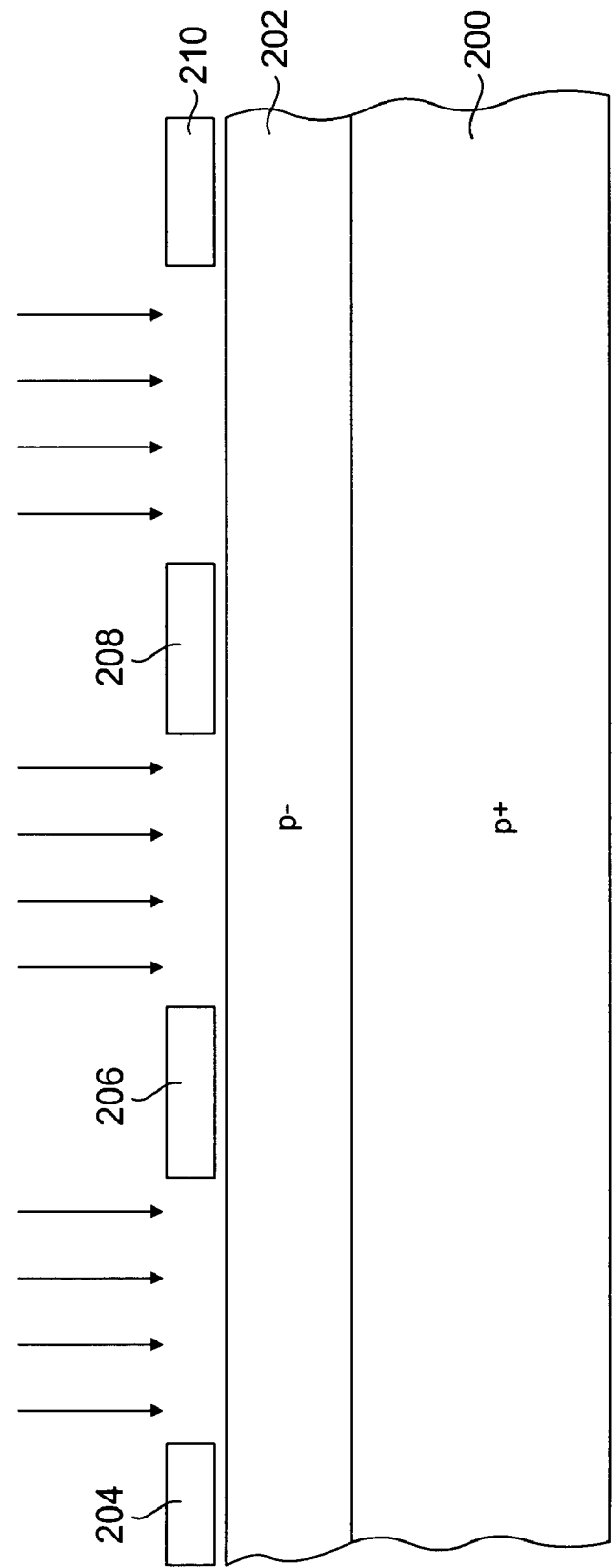
FIG. 9 illustrates, in cross-section, an implanting step, one step in a process for forming MOSFETs with different threshold voltages according to the teachings of the present invention.
Figure 10:
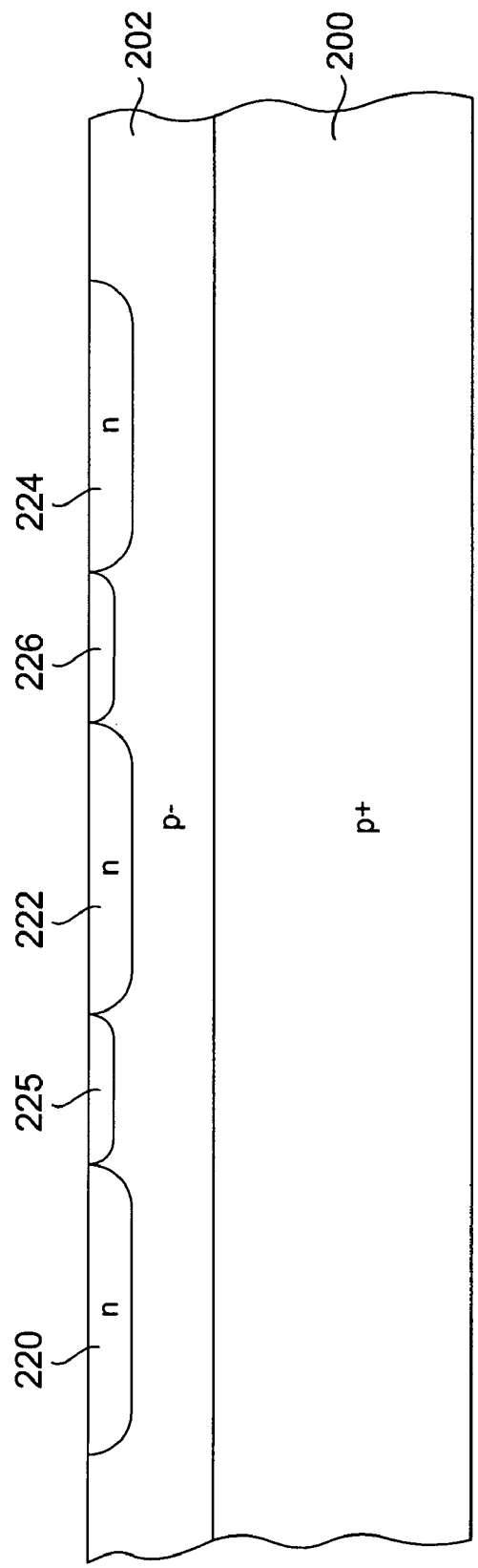
FIG. 10 illustrates, in cross-section, doped wells formed according to the implant step of FIG. 9.

As shown in FIG. 9, the first step in forming a plurality of MOSFETs and independently determining the threshold voltage for each, begins by implanting the wells or tubs. In FIG. 9, a substrate 200 (doped p+) underlies an epitaxially grown p– layer 202. Mask elements 204, 206, 208 and 210 are placed over the epitaxial layer 202 and phosphorous or arsenic dopant ions are implanted into the epitaxial layer 202 in the open spaces between the mask elements 204, 206, 208 and 210. The result is illustrated in FIG. 10, showing three n-type wells 220, 222 and 224. Those skilled in the art recognize that a greater or fewer number of wells can be formed according to the teachings of the present invention. Further, in another embodiment p-type wells for creating a p-channel MOSFET device can be formed by the same technique, using boron ions for the implant step. In one embodiment, each well 220, 222 and 224 is isolated from the adjacent well by a local oxidation of silicon (LOCOS) region 225 and 226. In another embodiment, shallow trench isolation can be utilized.

Figure 11:
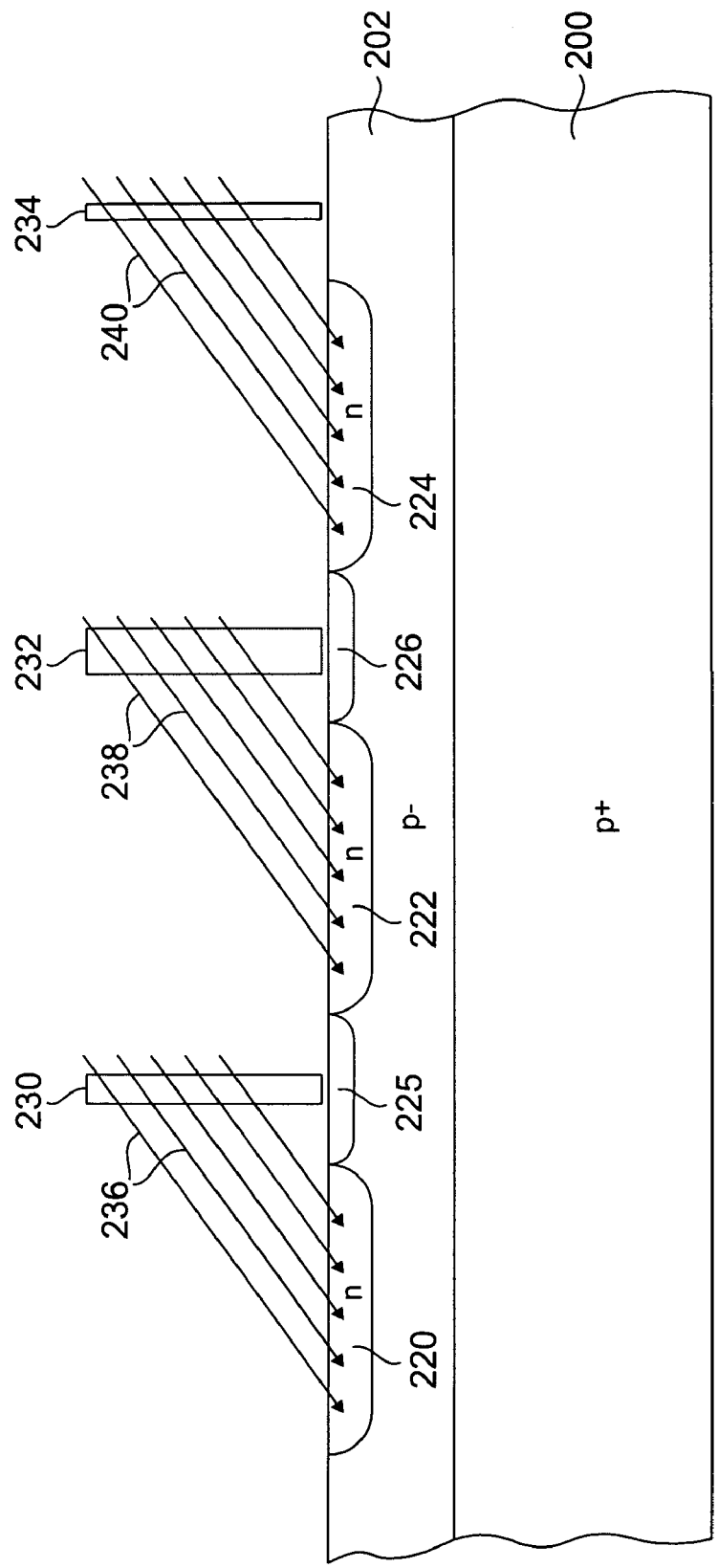
FIG. 11 illustrates, in cross-section, a tilted implanting step, one step in a process for forming MOSFETs with different threshold voltages according an embodiment of the present invention.

A layer of photoresist, silicon nitride, silicon dioxide or other material that is partially transmissive to the ions to be implanted through the mask element is formed over the epitaxial layer 202. A mask element having a plurality of different-width lines is created, and the mask is used to pattern the layer such that a line is located proximate each of the n-type wells that are to be implanted, for example, the n-type wells 220, 222 and 224. In the FIG. 11 exemplary embodiment, three such patterned lines 230, 232 and 234 are shown. The lines are of a different width, which in turn controls the doping density in the adjacent well due to the use of a tilted ion implant through the lines. Tilt angles of between about 7° and 60° are typical, although tilt angles between 1° and 89° are possible.

The arrowheads 236, 238 and 240 represent the tilted implantation of dopant ions in the wells 220, 222 and 224 respectively. Some of the ions are absorbed by the lines 230, 232 and 234, where the absorption rate is a function of the individual line width and the line material (each candidate material has a unique transmission coefficient for a specific ion). Thus the well 222 receives a lower implant doping than the well 224, because the line 232 is wider than the line 234. As a result, the threshold voltage for the MOSFET to be formed in the well 222 is lower than the threshold voltage of the MOSFET to be formed in the well 224. The line widths and material are selected to achieve the required MOSFET threshold voltage by controlling the implanted dopant density. Since the MOSFET channel region is formed in the well, MOSFETs with different threshold voltages can be fabricated throughout the integrated circuit using a single mask to form lines of varying width.

Figure 12A:
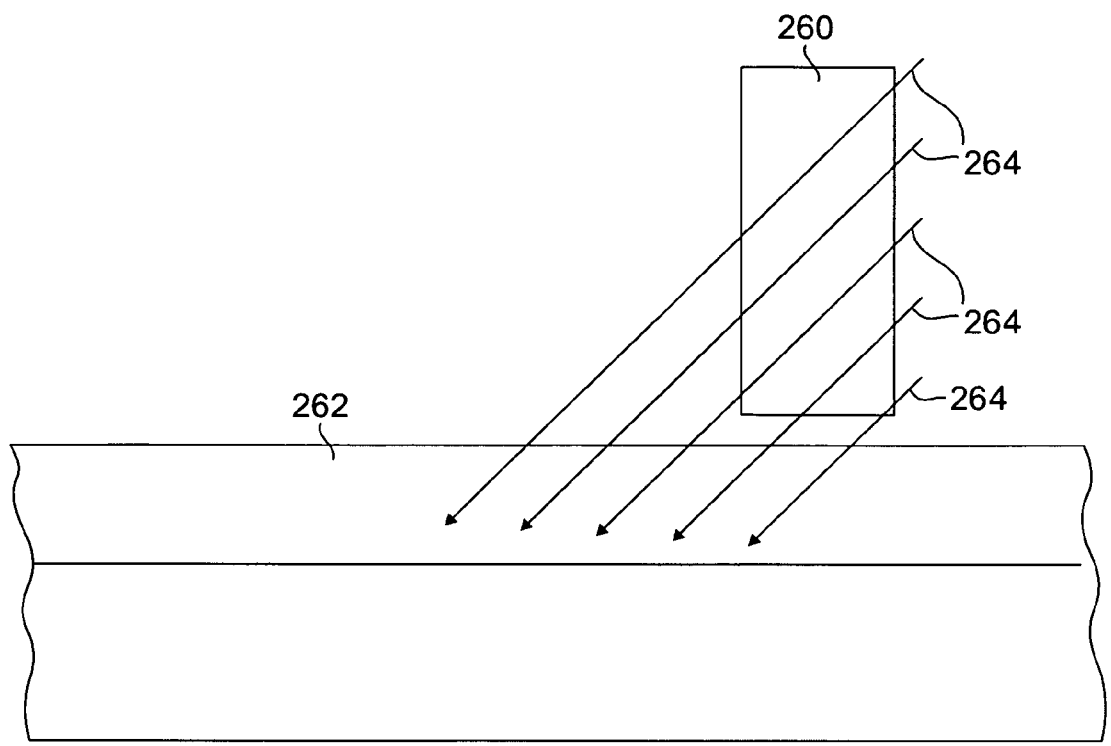
FIGS. 12A and 12B illustrate, in cross-section, a tilted implanting step and dopant profiles associated therewith according to an embodiment of the present invention.
Figure 12B:
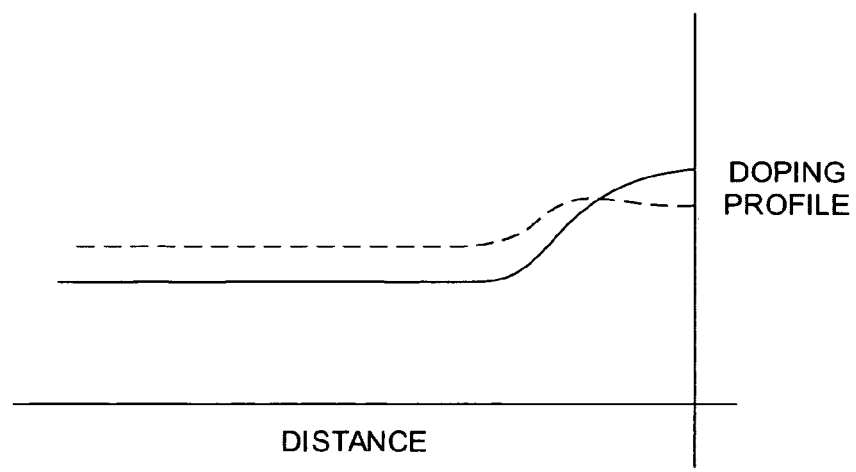

It is noted that the region of the well nearest the line may receive a higher implant dose than a region farther from the line as the implanting ions travel a greater distance in the masking layer in the latter case. See the example of FIG. 12A, illustrating a mask line 260 positioned above a semiconductor substrate 262, and a plurality of implanting rays 264. Note that the mask line is sufficiently high to permit all the implanting rays 264 to pass therethrough. FIG. 12B illustrates the doping profiles in the semiconductor substrate 262; the implant profile is represented by a solid line and the post-diffusion profile as a dashed line. To the extent this creates a lateral variation in the doping profile, the device threshold voltage is determined by the composite or average (loping density in the semiconductor substrate 262.

Figure 13A:
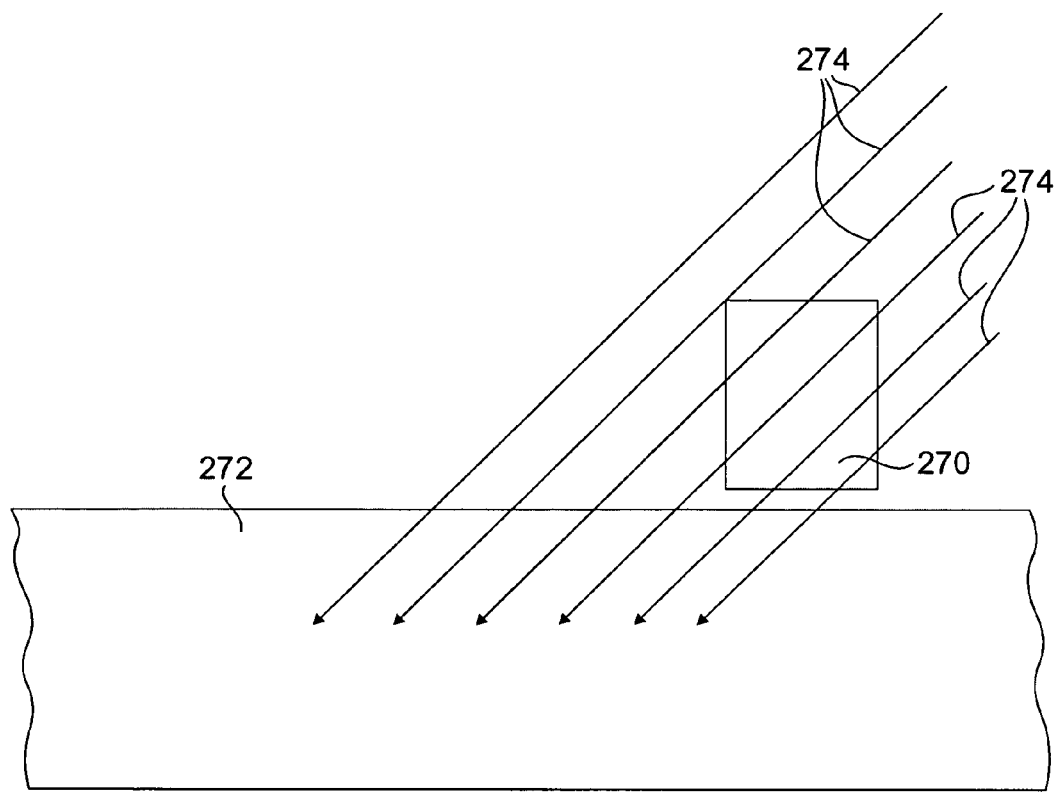
FIGS. 13A and 13B illustrate, in cross-section, a tilted implanting step and dopant profiles associated therewith according to the another embodiment of the present invention.
Figure 13B:
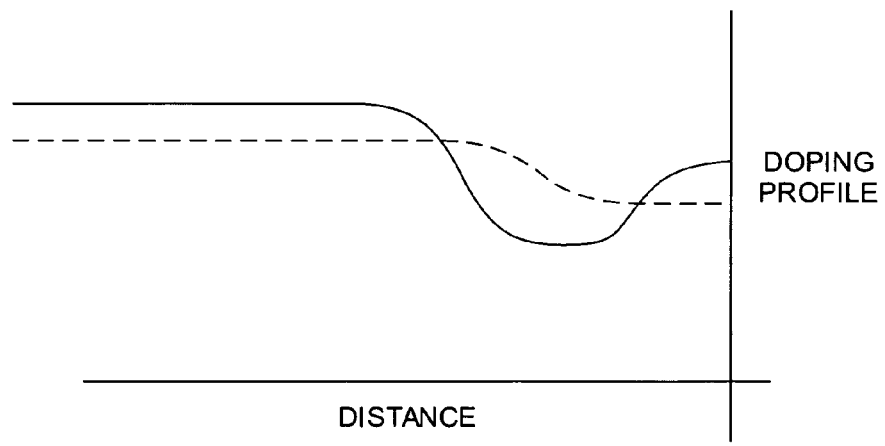

In the embodiment of FIG. 13A, a mask line 270 is positioned above a semiconductor substrate 272, but in this case the mask line 270 is not high enough for all the implant rays 274 to pass therethrough. Thus a number of the implant rays 274 pass through the mask line 270 and others pass above the mask 270. The resulting dopant profiles are illustrated in FIG. 13B, where the implanted profile is represented by a solid line and the post-diffusion profile by a dashed line. In this embodiment, the device threshold voltage is determined by the average or composite doping density in the semiconductor substrate 272.

Figure 14:
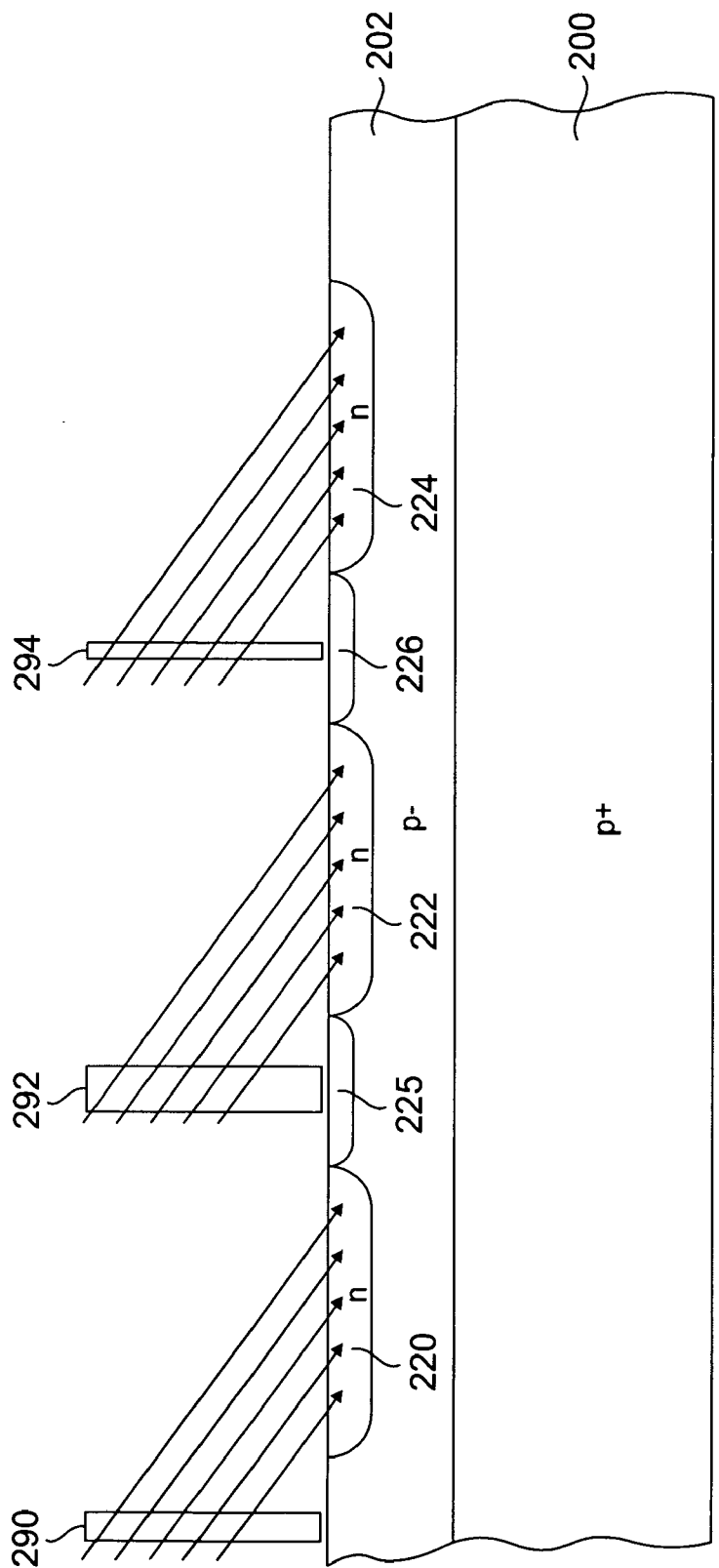
FIG. 14 illustrates, in cross-section, a mirror image implanting step with respect to the implanting step of FIG. 11, for forming MOSFETs with different threshold voltages according to an embodiment of the present invention.

In another embodiment of the present invention, a second implant is performed to create a relatively uniform dopant distribution across the well. As shown in FIG. 14, a mirror image of the FIG. 11 line pattern, comprising lines 290, 292 and 294 is formed on the opposite side of each well 220, 222 and 224, and a second tilted implant is performed from the opposite side as shown. Having been implanted from both sides of the well, tile dopant density across the well is relatively uniform.

Because a single mask is typically used to pattern the line width throughout the integrated circuit (or two masks if a more uniform dopant density is desired), the process according to the present invention is considerably less expensive than the prior art process which requires multiple masks to form MOSFETs with different threshold voltages. In one embodiment of the present invention, the lines 230, 232, and 234 are formed of photoresist material. In other embodiments, the lines are formed from polysilicon, silicon nitrite or silicon dioxide, all of which are common expedients used in conventional integrated circuit fabrication. To determine the width of each line, consideration must be given to the line material employed, as each material has a different transmission characteristic for the ions to be implanted.

From this point, the fabrication process proceeds according to conventional MOSFET fabrication steps. For each MOSFET, a gate oxide is grown or deposited and the gate is then formed. The gate serves as a mask for a first low-dose implant to form the lightly doped drain and source regions, also referred to as drain and source extensions. A relatively thick layer of silicon dioxide is then deposited, for instance, by chemical vapor deposition, and anisotropically etched, leaving only two sidewall spacers adjacent the gate. The spacers serve as a mask for a high-dose dopant implant to form the source and drain regions. After drive-in diffusion, the source and drain regions and the adjacent lightly-doped regions are formed.

As the MOSFET dimensions continue to shrink, certain disadvantageous operational characteristics develop, including drain induced barrier lowering. This phenomena, which occurs when there is unintended electrostatic interaction between the source and drain regions, is typically caused by improperly scaling of the device regions, i.e., the source and drain regions are too thick or the channel doping is too low. The result of drain induced barrier loading is punchthrough leakage or breakdown between the source and the drain, and the loss of gate control over the channel current. To avoid drain induced barrier lowering, the source and drain junctions must be made sufficiently shallow as the channel lengths are reduced. Also, the channel doping must be sufficiently high to prevent the drain from exercising control over the source junction, but increasing the doping concentration throughout the channel region may undesirably increase the threshold voltage. Thus the channel doping is increased by performing localized dopant implants in the channel near the source and drain regions. The localized implants are known as halo or pocket implants. The higher doping near the source and drain regions reduces the source and drain depletion width and prevents interaction between these two regions. The halo process uses a tilted implant geometry and is typically performed after gate formation. The implant results in a non-uniform lateral profile under the gate, while the lateral profile in the source and drain regions remains relatively uniform.

Figure 15A:
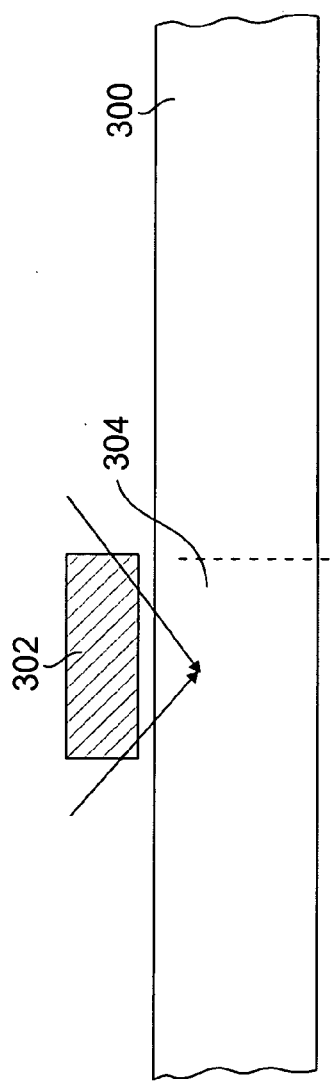
FIGS. 15A and 15B illustrate, in cross-section, a halo implanting step and dopant profiles associated therewith.
Figure 15B:
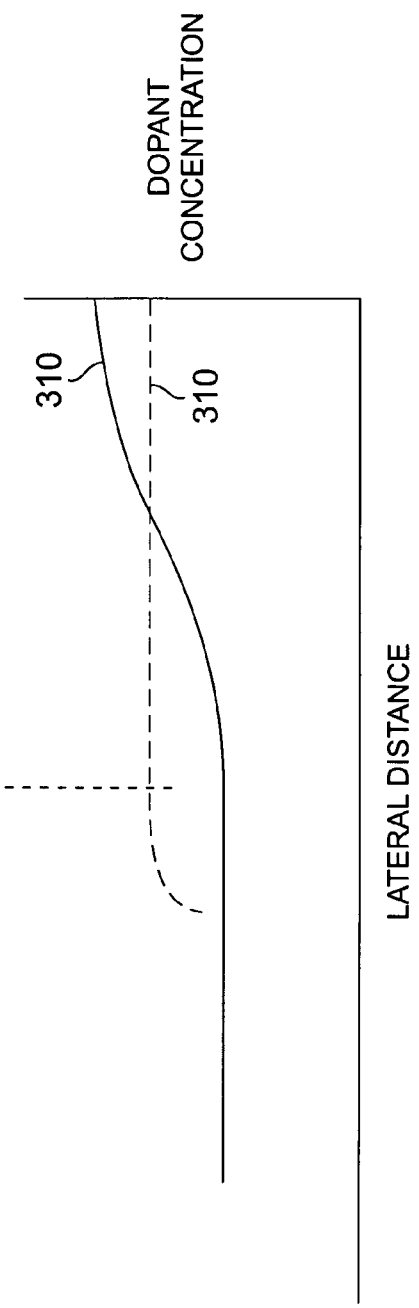

FIG. 15 illustrates such a halo implant in a semiconductor substrate 300. Implanting adjacent a gate mask 302 (i.e., the gate selves as the mask) over a region 304 of the semiconductor substrate 300 limits the doping concentration within the region 304. A line 310 in FIG. 15B represents an exemplary dopant concentration profile within the semiconductor substrate 300. After the halo implant, the dopant concentration is illustrated by a line 310. As shown, the doping profile outside the region 304 is relatively uniform, then becomes non-uniform under the gate mask 302. As applied to a MOSFET device, the region 304 represents the channel and the region of uniform doping concentration represents either the source or drain regions.

Figure 16A:
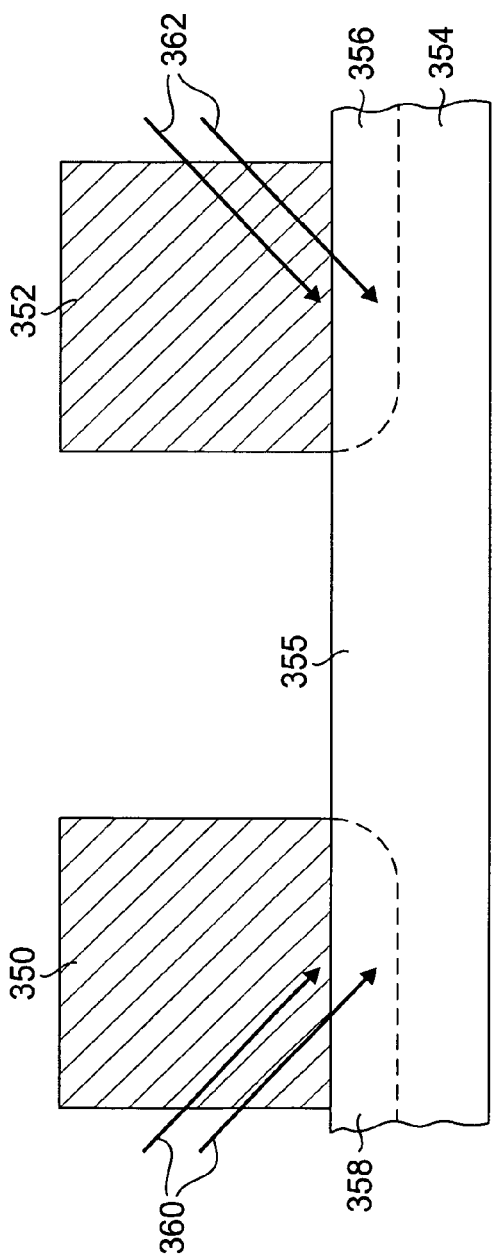
FIGS. 16A and 16B illustrate, in cross-section, an halo implanting step and dopant profiles associated therewith according to an embodiment of the present invention.
Figure 16B:
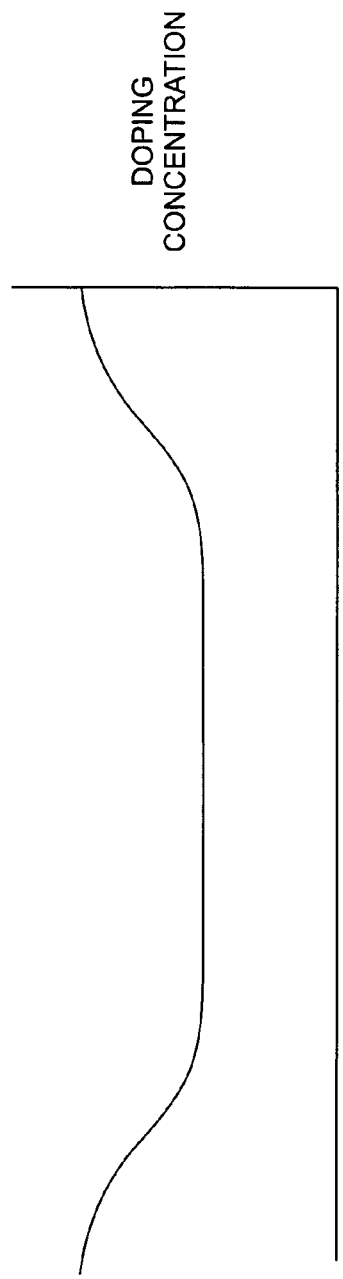

The teachings of the present invention can be used in conjunction with the halo implant as follows. As shown in FIG. 16A, two mask lines 350 and 352 overlie a substrate 354, including a tub or well region 355 of a MOSFET. Dashed lines illustrate the approximate location of the source/drain regions 356 and 358, which will be formed at a later stage in the process in the tub region 355. Ion implant rays 360 and 362 pass through the masked lines 350 and 352, respectively, to dope the tub 355 creating the doping profile illustrated in FIG. 16B, representing the doping profile along a horizontal plane through the source/drain regions 356 and 358.

Figure 17A:
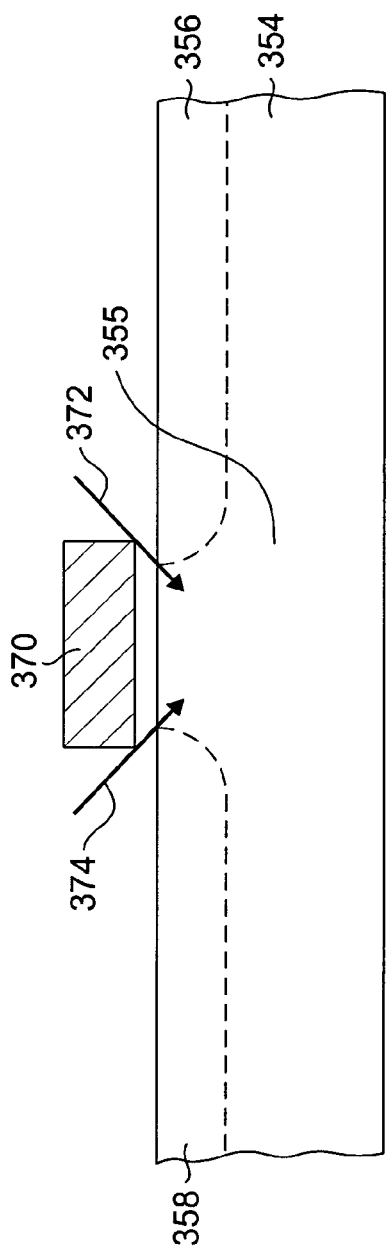
FIGS. 17A, 17B and 17C illustrate, in cross-section, a halo implanting step and dopant profiles associated therewith according to an embodiment of the present invention.
Figure 17B:
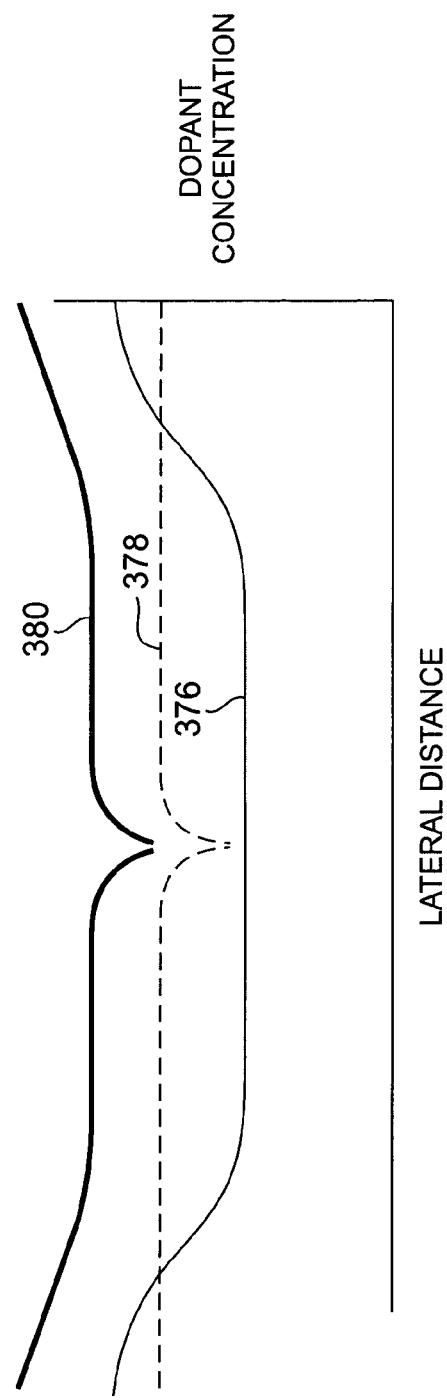
Figure 17C:
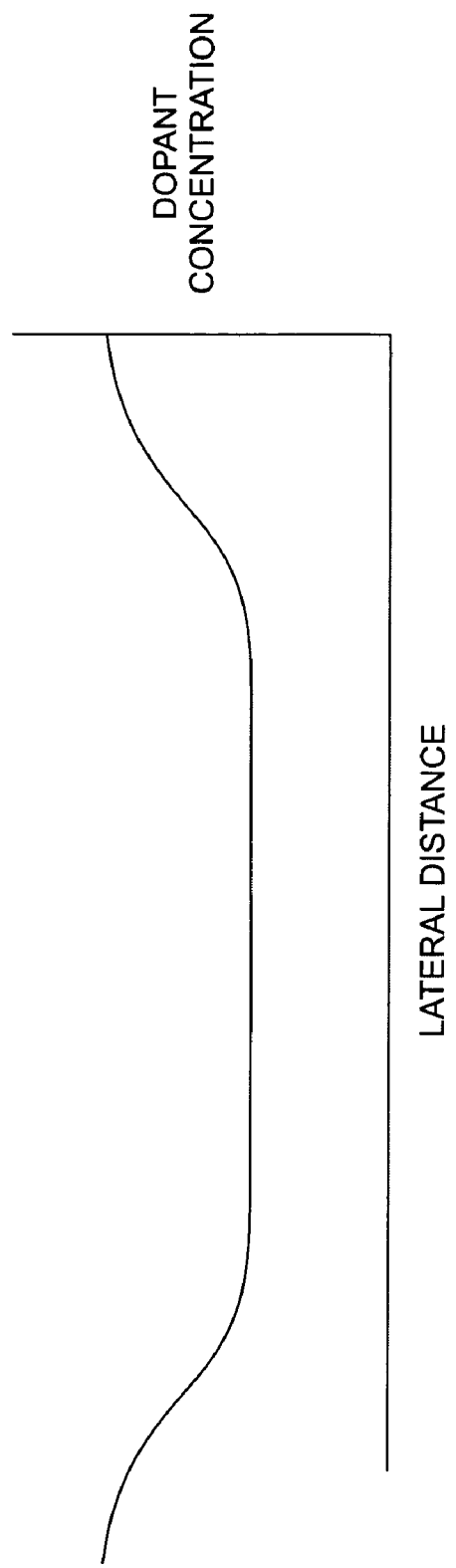

Next, a halo implant is performed using a gate mask 370 and implanting ion rays 372 and 374 as illustrated in FIG. 17A. With reference to FIG. 17B, the initial doping concentration is illustrated by a line 376 resulting from the process illustrated in FIG. 16A. The halo concentration is illustrated by a line 378 and the total concentration by a line 380. The net dopant concentration in the source/drain regions 356 and 358 is about two orders of magnitude greater than the concentration in the tub regions 355 below the source/drain regions 356/358. The latter concentration is illustrated in FIG. 17C. Note that it has the same shape as the concentration illustrated in FIG. 17B by the line 374. The dopant profiles in FIG. 17B also represent the z-direction (i.e., into the plane of the page) dopant concentrations.

The dopant profile of FIG. 17B is advantageous to reduce narrow width effects in MOSFETs having a gate width of less than about 1 μm. Specifically, one negative narrow width effect is an increase in the threshold voltage as, the channel width decreases. The dopant profile of FIG. 17B, with the higher concentrations in the regions away from the gate, reduces this threshold voltage increase.

Simulation results according to the present invention have shown that with a polysilicon line width of 0.65 micrometers, an implanted surface doping concentration of 1E17/cm3 is produced, and assuming certain physical characteristics for the simulated MOSFET, the resulting threshold voltage is 0.025 volts. When the line width is changed to 0.20 micrometers, the surface (loping concentration is 7E17/cm3 and the simulated threshold voltage is 0.400 volts.

A process has been described as useful for forming MOSFET tubs wherein the tubs comprise the channel region and have a controlled dopant density. While specific applications of the invention have been illustrated, the principals disclosed herein provide a basis for practicing the invention in a variety of ways and in a variety circuit structures, including structures formed with Group III–V compounds and other semiconductor materials. Although the exemplary embodiments pertain to tub-based MOSFETs, the teachings of the present invention can be applied to any devices or device region where the device characteristics are dependent on the doping concentration. For example, the dopant concentrations of silicon-on-insulator and bipolar junction transistors regions can be controlled by the tilted implant through a material layer as discussed above. For example, bipolar junction transistors with different gain values can be formed in an integrated circuit by controlling the base doping concentration using the techniques of the present invention. Also. numerous variations are possible within the scope of the invention, which is limited only by the claims that follow.

What is claimed is:

1. A method for fabricating a semiconductor device region comprising:
    forming a doped semiconductor region on a semiconductor layer;
    forming a first material line proximate the doped semiconductor region on a top surface of the semiconductor layer;
    performing a first tilted ion implantation through the first material line, wherein an ion beam intersects the first material line at an angle with respect to the top surface of the semiconductor layer such that an ion beam passes through the first material line prior to striking the doped semiconductor region, and wherein an implanted ion dosage reaching the doped semiconductor region to increase a dopant concentration thereof is dependent on an ion transmission properties of the first material line.

2. The method of claim 1 wherein the step of forming the first material line comprises forming a first layer over the semiconductor layer, patterning the first layer to identify the location of the first material line, and removing the material of the first layer except for the first material line.

3. The method of claim 1 wherein the material of the first material line is selected from a group consisting of silicon nitride, silicon dioxide, photo resist and polycrystalline silicon.

4. The method of claim 1 wherein a tilted angle is in the range of about 1 to 89 degrees.

5. The method of claim 1 wherein the width of the first material line is selected to control the ion implantation dosage reaching the doped semiconductor region.

6. The method of claim 1 wherein a height of the first material line is selected to control the ion implantation dosage reaching the doped semiconductor region.

7. The method of claim 1 further comprising:
    forming a second material line proximate the doped semiconductor region on an opposing side of the doped semiconductor region from the first material line;
    performing a second tilted ion implantation through the second material line, wherein the ion beam intersects the second material line at an angle with respect to the top surface of the semiconductor layer such that the ion beam passes through the second material line prior to striking the doped semiconductor region.

8. The method of claim 7 wherein after the first and the second tilted ion implantations a lateral dopant concentration in the doped semiconductor region is substantially uniform.

9. The method of claim 1 wherein the dopant concentration is laterally non-uniform.

10. A method of doping a semiconductor device region comprising:
    forming a plurality of doped semiconductor regions on a semiconductor layer by at least one dopant introduction step, wherein at least one doped semiconductor region is associated with one of a plurality of semiconductor devices;
    forming a material line proximate at least one of the plurality of semiconductor regions; and
    performing an ion implantation wherein an ion beam intersects the material line at an angle with respect to a top surface of the semiconductor layer such that the ion beam passes through the material line prior to striking the proximate semiconductor region, and wherein the implanted ions further increase the doping concentration of the doped semiconductor region, as determined by the ion transmissive properties of the material line.

11. The method of claim 10 wherein the doped semiconductor region is a semiconductor well.

12. The method of claim 10 wherein the material of the material line is selected from a group consisting of silicon nitride, silicon dioxide, photo resist and polycrystalline silicon.

13. The method of claim 10 further comprising:
    forming an opposing material line proximate and on the opposing side of the doped semiconductor region from the material line; and
    performing a second tilted ion implantation through the opposing material line, wherein the ion beam intersects the opposing material line at an angle with respect to the top surface of the semiconductor layer such that the ion beam passes through the opposing material line prior to striking the doped semiconductor region.

14. The method of claim 10 wherein a plurality of material lines are formed, and wherein a doping concentration in the doped semiconductor region is responsive to a width and a height of each material line.

15. A method for fabricating a plurality of field effect transistors, comprising:
    forming a plurality of doped semiconductor wells on a semiconductor substrate, wherein each doped semiconductor well is associated with a field-effect transistor;
    forming a plurality of material lines each proximate a doped semiconductor well, wherein each one of the plurality of material lines has a predetermined width;
    performing a tilted ion implantation through each one of the material lines such that an ion beam intersects each one of the plurality of the material lines at an acute angle with respect to the top surface of the semiconductor layer and strikes the proximate doped semiconductor well, and wherein the implanted ions further increase the doping concentration of the doped semiconductor well;

in each of the plurality of semiconductor wells, forming an oxide layer on a region of the semiconductor layer, wherein the region below the oxide layer defines a channel region;

forming a gate region over the oxide layer in each one of the plurality of semiconductor wells; and forming a source region and a drain region in each one of the plurality of doped semiconductor wells with the channel region therebetween;

wherein the combination of a source region, a drain region and a gate associated with each one of the plurality of doped semiconductor wells forms a field-effect transistor, and wherein a dopant density of the channel region is dependent on the transmission of ions through the material line, and wherein a threshold voltage of each field-effect transistor of the plurality of field-effect transistors is dependent on the dopant density.

16. The method of claim 15 wherein after the step of forming the doped semiconductor wells, the doped semiconductor wells have a minimal dopant density.

17. The method of claim 15 wherein the transmission of ions through each one of the material lines is a function of a material line width.

18. The method of claim 15 wherein the material line comprises silicon nitride, silicon dioxide, photo resist or polycrystalline silicon.

19. The method of claim 15 further comprising:

forming an opposing material line proximate and on the opposing side of the doped semiconductor well from the material line; and performing a second tilted ion implantation through the opposing material line, wherein the ion beam intersects the opposing material line at an angle with respect to a top surface of the semiconductor layer such that the ion beam passes through the opposing material line prior to striking the doped semiconductor well.

20. The method of claim 15 wherein a threshold voltage for the associated field-effect transistor is responsive to a width and a height of each one of the plurality of material lines.

* * * * *